US 6,569,813 B2

(12) United States Patent
Kitaguchi et al.

(10) Patent No.: US 6,569,813 B2
(45) Date of Patent: May 27, 2003

(54) METHOD OF PRODUCING OXIDE SUPERCONDUCTIVE COMPOSITE MATERIAL

(75) Inventors: Hitoshi Kitaguchi, Tsukuba (JP); Hirohaki Kumakura, Tsukuba (JP); Kazumasa Togano, Tsukuba (JP)

(73) Assignee: Japan as represented by Director General of National Research Institute for Metals, Ibaraki (JP)

( * ) Notice: Subject to any disclaimer, the term of this patent is extended or adjusted under 35 U.S.C. 154(b) by 0 days.

(21) Appl. No.: 09/765,275

(22) Filed: Jan. 22, 2001

(65) Prior Publication Data

US 2001/0007849 A1 Jul. 12, 2001

Related U.S. Application Data

(63) Continuation of application No. 09/441,886, filed on Nov. 17, 1999, now abandoned.

(30) Foreign Application Priority Data

Nov. 17, 1998 (JP) ............................................. 10-327197

(51) Int. Cl.[7] .............................................. C04B 35/64
(52) U.S. Cl. ...................................................... 505/501
(58) Field of Search ................................ 505/121, 124, 505/236, 501, 490

(56) References Cited

U.S. PATENT DOCUMENTS

| 5,846,910 A | 12/1998 | Funahashi et al. .......... 505/430 |
| 6,074,991 A | 6/2000 | Jenovelis et al. ........... 505/501 |

OTHER PUBLICATIONS

Funahashi et al., Physica C, 273, pp. 337–341, 1997.

*Primary Examiner*—Mark Kopec
(74) *Attorney, Agent, or Firm*—Wenderoth, Lind & Ponack, L.L.P.

(57) ABSTRACT

A method of producing a composite material of a bismuth 2212 phase and a metallic substrate, wherein the first and second baking are conducted as an isothermal heat treatment. According to this process, temperature control is easy, high productivity is obtained, and the critical current density is improved.

7 Claims, 3 Drawing Sheets

Fine Structure of a Superconducting Layer (Prepared by Method of Present Invention)

Fine Structure of a Superconducting Layer (Prepared by Conventional Method)

10 μm

METHOD OF PRODUCING OXIDE SUPERCONDUCTIVE COMPOSITE MATERIAL

This is a continuation of Ser. No. 09/441,886, filed Nov. 17, 1999, now abandoned.

FIELD OF THE INVENTION

The present invention relates to a method of producing oxide superconductor composite materials. More specifically, the invention relates to a novel method of producing oxide superconductor composite materials which are useful as superconducting wires, such as various superconducting magnets, superconducting transmission cables, or magnetic shields, used in superconducting equipment, which have higher critical current densities than those of previously known materials, and can easily be produced.

BACKGROUND OF THE INVENTION

The 2212 phase and the 2233 phase known as Bi oxide high-temperature superconductors have been actively studied to achieve practical use as superconducting wires.

Various methods including a coating method and a silver sheathing method have been formerly proposed, for producing wires of oxide superconductors. In all such methods, a combination of a metallic substrate (such as silver) and an oxide superconductor has been employed. For a bismuth 2212 ($Bi_2Sr_2CaCu_2O_x$) wire, regardless of the method chosen, in order to obtain a wire of excellent characteristics, with high critical current density, the material is first heated above the decomposition temperature of bismuth 2212 to provide a partially molten state, then is either slowly cooled, or the atmosphere (temperature or oxygen pressure) is controlled to change the solidification point. Crystals are again grown to obtain an oriented structure required to provide high critical current density. However, in such methods, the characteristics are much influenced by the state of the partial melt. Therefore, the permissible range of the temperature for heat treatment to provide excellent characteristics, becomes as narrow as ±2° C. the optimum temperature. Thus, it must be said that this method has technical problems when applied to the production of large-sized products. Therefore, overcoming such technical difficulties in producing large-sized products without decreasing the characteristics, by widening the permissible range of the heat treatment temperature, and reducing the cost by improving yield, are important goals.

SUMMARY OF THE INVENTION

In view of the above situation, the present invention has been invented as a result of intensive study, and its main object is to provide a novel method which allows easy production of a superconducting composite material for a wire having excellent productivity and higher critical current density.

BRIEF DESCRIPTION OF THE DRAWINGS

The foregoing and other objects, features and advantages of the present invention will be better understood from the following detailed description, taken in conjunction with the accompanying drawings, in which.

DETAILED DESCRIPTION OF THE INVENTION

Figure 1:
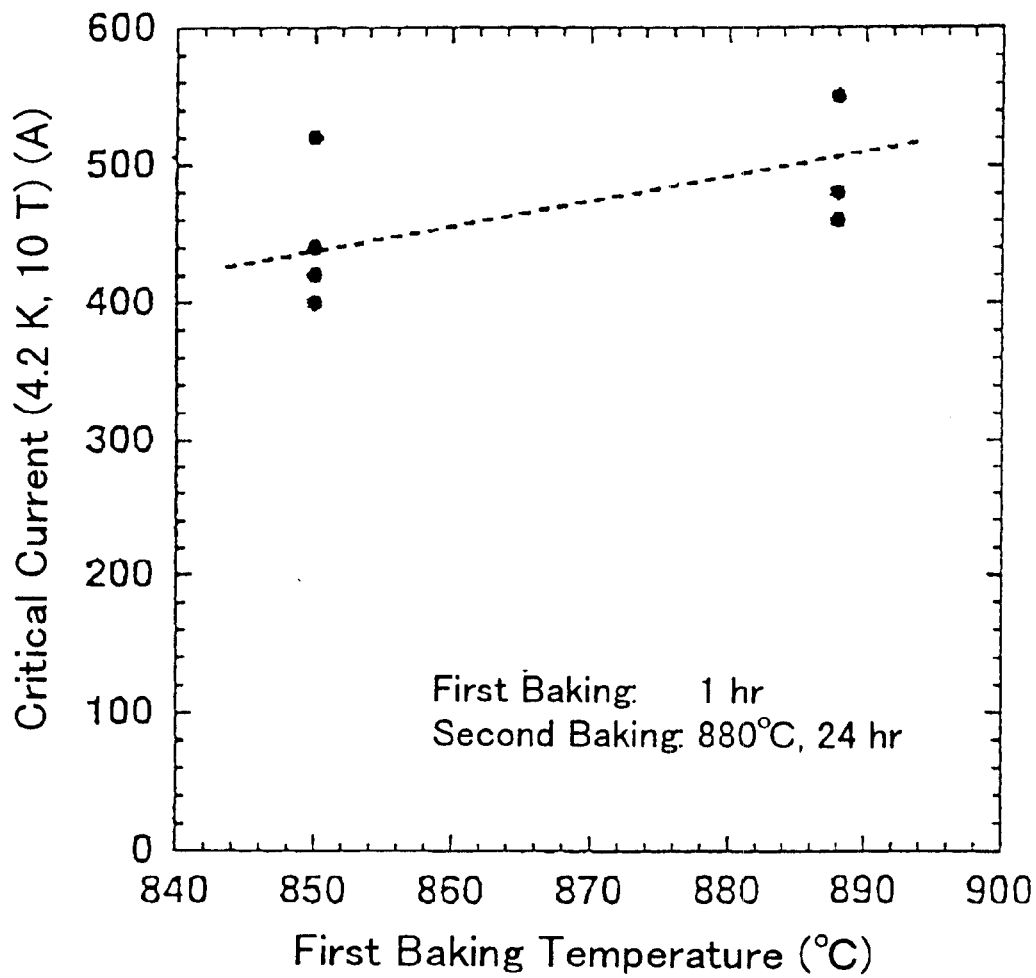
FIG. 1 is a graph showing the relationship between the first baking temperature and the critical current.

According to the present invention, the superconductor is composed mainly of a Bi-type 2212 phase, namely, a $Bi_2Sr_2CaCu_2O_x$ phase. Other elements may be added or the composition may be finely controlled, as long as the 2212 crystal phase is maintained and the superconductivity is not impaired. These superconductors are combined with a metallic substrate, typically silver (Ag) and silver alloy, as in conventional methods. Of course, the substrate may be chosen from a variety of substances in order to assure ease in processing.

For the Bi-type superconducting composite materials, which are obtained by a method containing a baking step, baking is conducted as an isothermal treatment at two stages or more. Generally, the first baking is not effective at temperatures bellow 700° C. Therefore, it is more favorable to conduct the first baking at a temperature of 700° C. or higher, more specifically at a temperature in the range of 700 to 900° C. Furthermore, taking in consideration the range of temperature at which chemical stability of the Bi-type 2212 phase is assured, it is more favorable to conduct the second baking at temperatures in the range of 800 to 900° C.

The baking time should generally be 10 minutes or more for both the first and second baking steps. It is however, more preferable that the second baking is conducted longer than the first baking, desirably 1 hour or more.

For the isothermal treatment at the first and second baking process, it is favorable to maintain a constant atmosphere. During the baking process, it is preferable that the partial pressure of oxygen is fixed between 0.1 and 10 atm. The oxygen gas used in this process may be mixed with an inert gas such as a rare gas or nitrogen gas. Although crystals have formerly been grown by changing the atmosphere, in the present invention, it is more favorable to have the atmosphere fixed rather than changed.

The first and second baking may be conducted successively in this order. A process where the material is plastic worked may be conducted between the first and second baking. The cold working process is effective in improving the characteristics of the wire. In addition, the gradual cooling of the substrate at a rate of 1 to 10° C./hr after the second baking may be performed for further improvement of the critical current.

The baking of the composite material may be, for example, a metallic substrate having a material film on its surface which is capable of forming a bismuth (Bi) 2212 superconductive phase, a composite material obtained by further wrapping this substrate with a foil of metallic substrate, or a composite wire obtained by encapsulating a material capable of forming a bismuth (Bi) 2212 superconductive phase into a tube of a metallic substrate. The form of the substrate, therefore, is not particularly limited.

The invention is illustrated more specifically by referring to the following Example.

EXAMPLE

A silver (Ag) foil was coated with a mixture of an oxide which produces bismuth 2212 superconductive phase ($Bi_2Sr_2CaCu_2O_x$) by baking and an organic solvent, dried, and subjected to tentative baking to form a thick film. This composite film was wrapped with a silver (Ag) foil to provide a wire with an exposed surface of silver (Ag).

This product was then subjected to a first baking step as an isothermal heat treatment under a stream of pure oxygen gas with a constant concentration at a temperature of 850° C. or 880° C. for 10 minutes or 1 hour. The oxygen partial pressure was 1 atm.

After the first baking, the product was cooled to room temperature, and cold-plastic worked. This process was conducted once using a pressure roll, and the deformation rate (sectional shrinkage rate) was set at 25%.

Subsequently, the second baking was conducted as an isothermal heat treatment under a constant stream of pure oxygen gas with a partial pressure of 1 atm, at a temperature in the range of 860 to 880° C. for a period of 24 to 100 hours.

The critical current density of the resulting composite material after the second baking was measured by a direct current four terminal method. Furthermore, the critical current was measured in a magnetic field of 10 T at 4.2K.

FIG. 1 shows the relationship between the first baking temperature and the critical current. In this case, the first baking was conducted for 1 hour, and the second baking was conducted at 880° C. for 24 hours. It is apparent that when the first baking temperature is 850° C. and 888° C., the critical current value exceeds 400 A. Also, the best property, obtained in this experiment, was a critical current value of 550 A. When another untreated wire of the same material was heat-treated through conventional methods of melt-cooling process, the critical current was approximately 400 A. Thus, the process of the invention provides properties which are equal to, or higher than, those in the related art.

Figure 2:
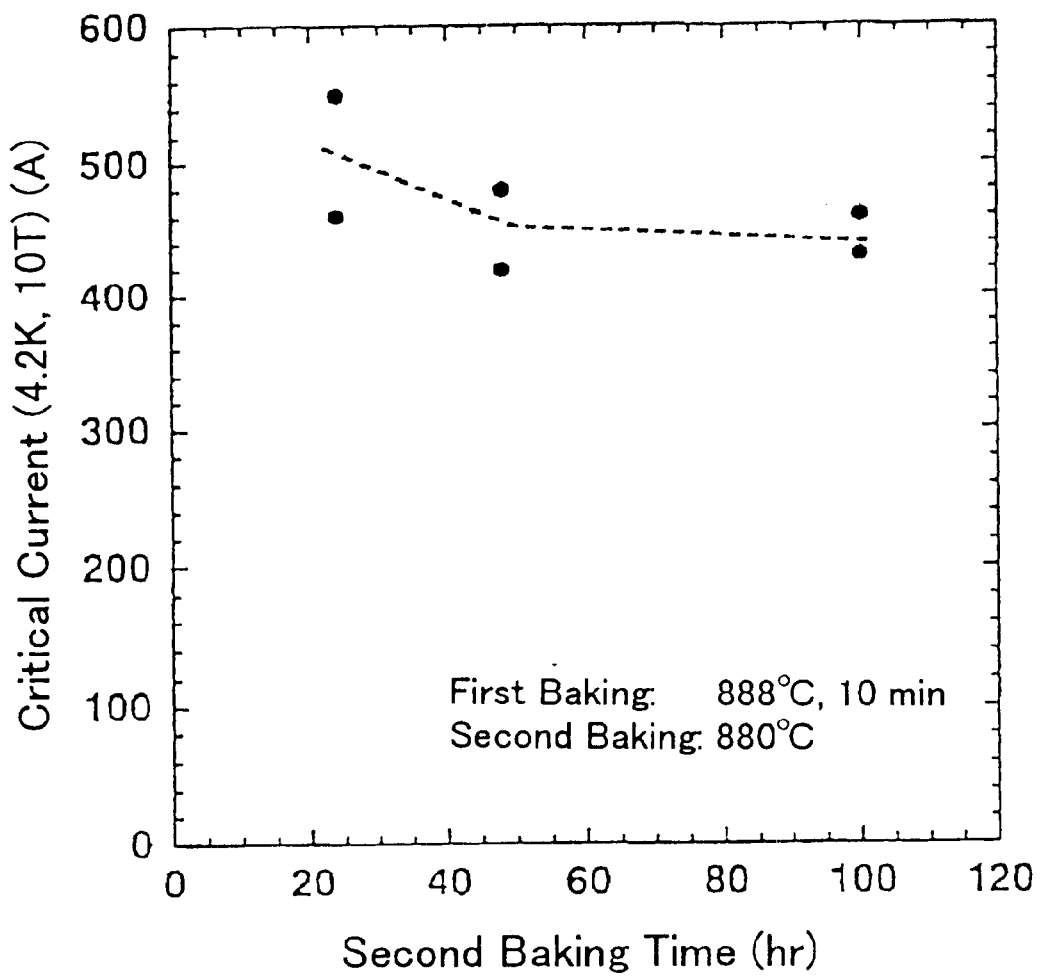
FIG. 2 is a graph showing the relationship between the second baking time and the critical current.

FIG. 2 shows the relationship between the second baking time and the critical current. In this case, the first baking was conducted at 888° C. for 10 minutes, and the second baking was conducted at 880° C. for 24, 48 and 100 hours. It is found that a critical current of approximately 500 A is obtained for the sample baked fore 24 hours. In addition, a critical current exceeding 400 A was obtained for the sample after a treatment of 48 or 100 hours.

Figure 3:
FIG. 3 is a photograph of the fine structure of a superconducting phase within a wire, after heat treatment according to the present invention, shown in comparison to that obtained by a former method.
Figure 3:
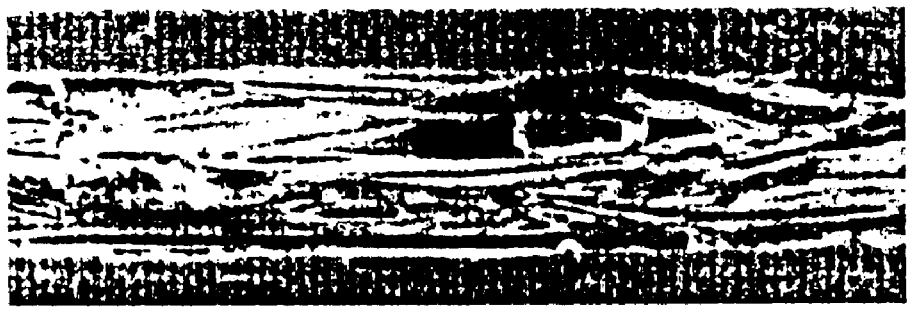

Furthermore, FIG. 3 shows the fine structure of the superconductive phase in a wire subjected to heat treatment.

A product prepared by the method introduced in the present invention, and a product prepared by a conventional method of partial melting-cooling treatment are shown therein for comparison. The present invention provides an oriented particle structure required for excellent properties. The degree of particle orientation and the density of the product prepared by the new process resemble those of the related art.

As has been described above specifically, it is possible, in accordance with the present invention, to overcome problems caused by non-uniformity of temperature within a product during heat treatment, by conducting the isothermal heat treatment for a period of time longer than that formerly possible. Consequently, the yield is improved, thereby reducing the production cost, and the size of the product may also be increased. Thus, the invention is expected to be applicable in various areas.

What is claimed is:

1. A method of producing oxide superconducting composite materials, which comprises performing at least first and second baking as isothermal heat treatments, for a composite of a superconductor comprising a $Bi_2Sr_2CaCu_2O_x$ compound oxide superconducting phase, and a metallic substrate, and said isothermal treatments being performed in an atmosphere containing oxygen wherein a partial pressure of the oxygen throughout said isothermal treatments is constant.

2. The method as in claim 1, wherein the oxygen partial pressure is in the range of 0.1 and 10 atm.

3. The method as in claim 1, wherein baking is conducted as an isothermal treatment such that the first baking is conducted at a temperature in the range of 700 to 900° C. and the second baking is conducted at a temperature in the range of 800 to 900° C.

4. The method as in claim 1, wherein gradual cooling is conducted at a rate of 1 to 10° C./hr after the second baking.

5. The method as in claim 1, wherein the first baking and the second baking are conducted successively.

6. The method as in claim 1, wherein cold plastic working is conducted between the first and second baking.

7. The method as in claim 1, wherein the metallic substrate is silver or a silver alloy.

* * * * *